(12) United States Patent
Marshall et al.

(10) Patent No.: US 6,844,751 B2
(45) Date of Patent: Jan. 18, 2005

(54) MULTI-STATE TEST STRUCTURES AND METHODS

(75) Inventors: Andrew Marshall, Dallas, TX (US); George E. Harris, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 142 days.

(21) Appl. No.: 09/965,452

(22) Filed: Sep. 26, 2001

(65) Prior Publication Data

US 2002/0047724 A1 Apr. 25, 2002

Related U.S. Application Data

(60) Provisional application No. 60/237,080, filed on Sep. 30, 2000.

(51) Int. Cl.[7] ............................................... G01R 31/26
(52) U.S. Cl. .................... 324/765; 324/73.1; 324/158.1
(58) Field of Search ................................ 324/73.1, 763, 324/765, 158.1; 438/14, 17, 68, 113, 460, 462; 257/48, 208, 620, 692

(56) References Cited

U.S. PATENT DOCUMENTS

| | | | |
|---|---|---|---|
| 3,781,683 A | * | 12/1973 | Freed ........................ 324/765 |
| 3,849,872 A | * | 11/1974 | Hubacher .................... 438/17 |
| 4,218,650 A | | 8/1980 | Matzen et al. |
| 4,347,479 A | | 8/1982 | Cullet |
| 4,516,071 A | | 5/1985 | Buehler |
| 4,560,583 A | | 12/1985 | Moksvold |
| 4,638,341 A | | 1/1987 | Baier et al. |
| 5,059,899 A | * | 10/1991 | Farnworth et al. ......... 324/73.1 |
| 5,065,090 A | | 11/1991 | Gheewala |
| 5,132,613 A | | 7/1992 | Papae et al. |
| 5,239,270 A | | 8/1993 | Desbiens |
| 5,264,377 A | | 11/1993 | Chesire et al. |
| 5,286,656 A | | 2/1994 | Keown et al. |
| 5,370,923 A | | 12/1994 | Goad et al. |
| 5,383,136 A | | 1/1995 | Cresswell et al. |
| 5,446,395 A | * | 8/1995 | Goto .......................... 324/763 |
| 5,485,095 A | | 1/1996 | Bertsch et al. |
| 5,552,718 A | | 9/1996 | Bruce et al. |
| 5,617,340 A | | 4/1997 | Cresswell et al. |
| 5,670,883 A | | 9/1997 | O'Donoghue et al. |
| 5,675,179 A | | 10/1997 | Shu et al. |
| 5,821,765 A | | 10/1998 | Ling et al. |
| 5,838,163 A | * | 11/1998 | Rostoker et al. ............ 324/763 |
| 5,897,728 A | | 4/1999 | Cole et al. |
| 5,916,715 A | | 6/1999 | Fulford, Jr. et al. |
| 5,929,650 A | * | 7/1999 | Pappert et al. .............. 324/763 |
| 5,952,838 A | | 9/1999 | Tikhonov |
| 5,993,020 A | | 11/1999 | Koike |
| 6,066,561 A | | 5/2000 | Kumar et al. |
| 6,072,192 A | | 6/2000 | Fulford, Jr. et al. |
| 6,087,189 A | | 7/2000 | Huang |
| 6,291,835 B1 | * | 9/2001 | Tsuji et al. .................. 257/48 |

* cited by examiner

*Primary Examiner*—Minh N. Tang
(74) *Attorney, Agent, or Firm*—Yingsheng Tung; Wade James Brady, III; Frederick J. Telecky, Jr.

(57) ABSTRACT

A test selector that multiplexes different test structures (202) to an adjacent probe pad (206) in dependence on the probe voltage. In addition, a scribeline test circuit is disclosed that includes a test selector circuit located in a single scribeline portion between two adjacent die locations. Multiple test structures and at least one probe pad also are located in the single scribeline portion. The test selector circuit makes an electrical connection from the probe pad to a selected one of the test structures depending upon a voltage applied at the probe pad.

14 Claims, 6 Drawing Sheets

MULTI-STATE TEST STRUCTURES AND METHODS

This application claims priority under 35 USC §119(e)(1) of provisional application No. 60/237,080 filed Sep. 30, 2000.

BACKGROUND AND SUMMARY OF THE INVENTION

The present invention relates to integrated circuit fabrication, and specifically to structures and methods for electrical testing and/or for process monitoring.

A critical part of semiconductor manufacturing and design is the testing of integrated circuits. Before the functionality tests at the end of processing, additional testing for process monitoring is also useful. Testing for process monitoring uses special test structures which are not part of the integrated circuit's functionality. Process monitoring helps to detect problems which may cause reliability problems in the field, helps to optimize the process for maximum yield, and helps to catch any process deviations before too much work-in-process is wasted.

Typical electrical test structures for in-process testing are long series-connected chains of similar elements (to test for excessive resistance or open circuits). The test structure will also include two or more "probe pads," which are flat metal surface that electrical connection can be made to them in the test lab. These test structures are manufactured at the same time as the functional circuitry, using the same process steps, but are specially designed to test particular process parameters. (For example, to test for specific contact resistance a chain of thousands of series-connected contacts might be created.) A large variety of test structures are used by process engineers to test various process stages and device portions.

A "wafer" is a flat disk of semiconductor material on which integrated circuits are made by microfabrication techniques. After fabrication is complete, the wafer will be separated into rectangular "dice," each of which is the electronics portion of one integrated circuit. (The dice will be packaged to provide the end-product integrated circuits.) Typically one wafer will provide dozens or hundreds of dice.

When the dice are separated, some of the wafer surface between them is wasted. This space is known as "scribelines," since the dice were formerly separated by scribing and fracturing; now that diamond sawing has replaced scribing, these spaces are also known as "saw streets."

Test structures are placed within the scribelines of the wafer (and in other places), typically once or more per photolithographic field. Typical scribeline test structures are individually connected to corresponding probe pads, also located in the scribelines. Since the area within the scribelines is densely occupied, the size and number of probe pads is critical. However, probe pad size has not scaled as fast as other process steps, and the space available within the scribelines is very limited. Placing multiple test structures and probe pads for those test structures within this limited area becomes difficult in many processes, and limits the testing of the wafer fabrication process. Limits to the testing capability lead to less reliable integrated circuits.

Scribeline widths, as of 2000, are typically less than a tenth of a millimeter. Probe pads are typically made just small enough to fit within the scribeline. These dimensions can be expected to change over time, in dependence on wafer fabrication and separation technologies; but the key point is that each probe pad occupies a very significant fraction of the limited available scribeline area.

Since each probe pad nearly fills the width of a scribeline, the layout of test structures in the scribelines is often somewhat one-dimensional. That is, a test structure in the scribelines can be allowed to take up nearly the entire width of the scribeline, and extended along the scribeline as far as necessary.

Some space in the corners of the dice themselves is typically also allocated for test patterns, but again the available area is limited. (Typically several to several tens of test structures can fit into each corner of a die.)

Thus the disclosed selection architecture can be used for scribeline test structures only, for scribeline test and on-die test structures, or (less preferably) for on-die test structures only.

Some space for test structures is also available along the edge of the wafer, where the grid of square or rectangular dice meets the unusable width of the rounded edge. While these spaces are relatively large, they are far from the important central areas of the wafer. Thus test structures in the edge-of-wafer corners cannot provide sufficiently close monitoring of process variation, including spatial variation across the wafer.

One basic tool for process monitoring is the use of pilot wafers. Some manufacturers will start several pilot or dummy wafers for each wafer which will produce actual chips. While some use of pilot wafers will always be common (e.g. at the head of each lot), every pilot wafer start takes the place of a wafer full of salable chips. Thus to the extent that sufficient process monitoring can be done using on-chip test and monitoring structures, this is greatly preferable to use of pilot wafers. (Dummy wafers, on the other hand, are used to ensure that equipment has stabilized, e.g. when a bulk furnace is being ramped up or when a wet processing station has been refilled. Use of such dummy wafers is not motivated by process monitoring needs, and hence would not appear to be subject to trade-off against on-wafer test structures.)

There is therefore a need in the art for a way to increase the efficiency of space usage for test structures within the scribelines of an integrated circuit process.

Multi-State Test Structure

By adding a test selector to the test structure, multiple test structures are multiplexed to one (or more) probe pads. Selection of which test structure is to be accessed from a given probe pad is preferably performed entirely by control of the voltage applied across the probe pads. In one class of embodiments, the applied voltage directly determines which test structure will be accessed. In another class of embodiments, modulation of the applied voltage controls sequential logic which selects one of multiple test structures for access.

Thus the selection capability provided by the present invention radically increases the number of test structures per probe pad. In a further class of embodiments, this increase is used to allow sampled testing. That is, not all test structures are tested on every wafer: instead some test structures can be monitored occasionally (in accordance with standard procedures for statistical quality control). Other test structures can be reserved for diagnostic use, and only monitored when a problem is suspected.

Advantages of the disclosed methods and structures, in various embodiments, can include one or more of the following:

more test structures can be made larger;
quicker correction of process deviations;
increased efficiency of use of wafer area;

increased efficiency of use of scribeline area;
fewer probe pads are needed;
increased yield;
increased capability for "early warning" testing increases reliability of the integrated circuits.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
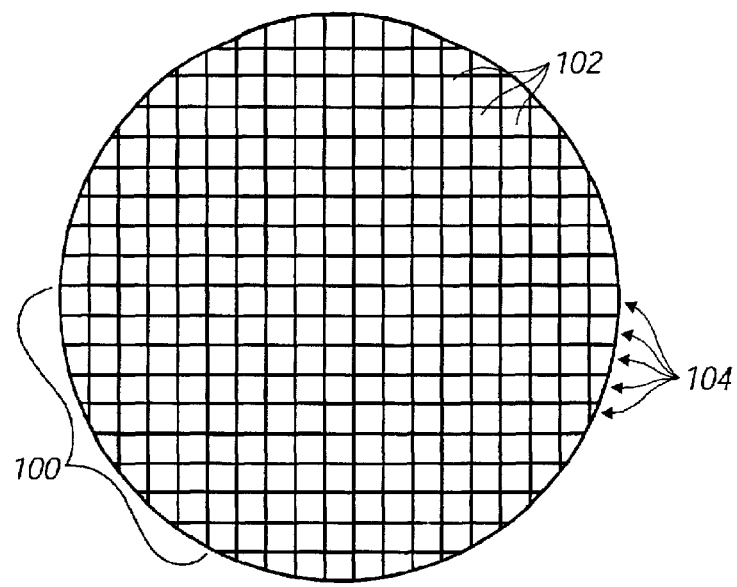
FIG. 1 shows a wafer with integrated circuits formed thereon.

FIG. 1 shows a wafer 100 on which individual chips 102 are being built. The chips 102 are divided by scribelines 104. As described below, the area of the scribelines 104 will be used to place test structures and test selectors, so that area on the wafer is used efficiently. The test selectors comprise circuit elements that accept an input signal and multiplex one of several test structures to the probe pad depending on that input signal. In this way, a single probe pad can be used to test several test structures on a wafer, thus reducing the number of probe pads and improving the efficiently of the testing process.

The test structures and test selectors are made on the wafer surface in the same way that other circuit features are produced. In the preferred embodiment, this includes the typical integrated circuit fabrication processes, such as photolithography, etches, depositions, etc. These features are placed on the wafer area that is later used for scribelines that separate the several chips on the wafer. When the chips are physically separated from one another (by sawing, breaking, etc.), the test structures and test selectors are destroyed. These test structures and test selectors are normally not connected to any circuitry on the chips themselves.

The test selectors are used to select from multiple test structures according to an input signal. When a particular test structure is selected, that test structure is connected to the probe pads and its electrical characteristics are tested.

Figure 2:
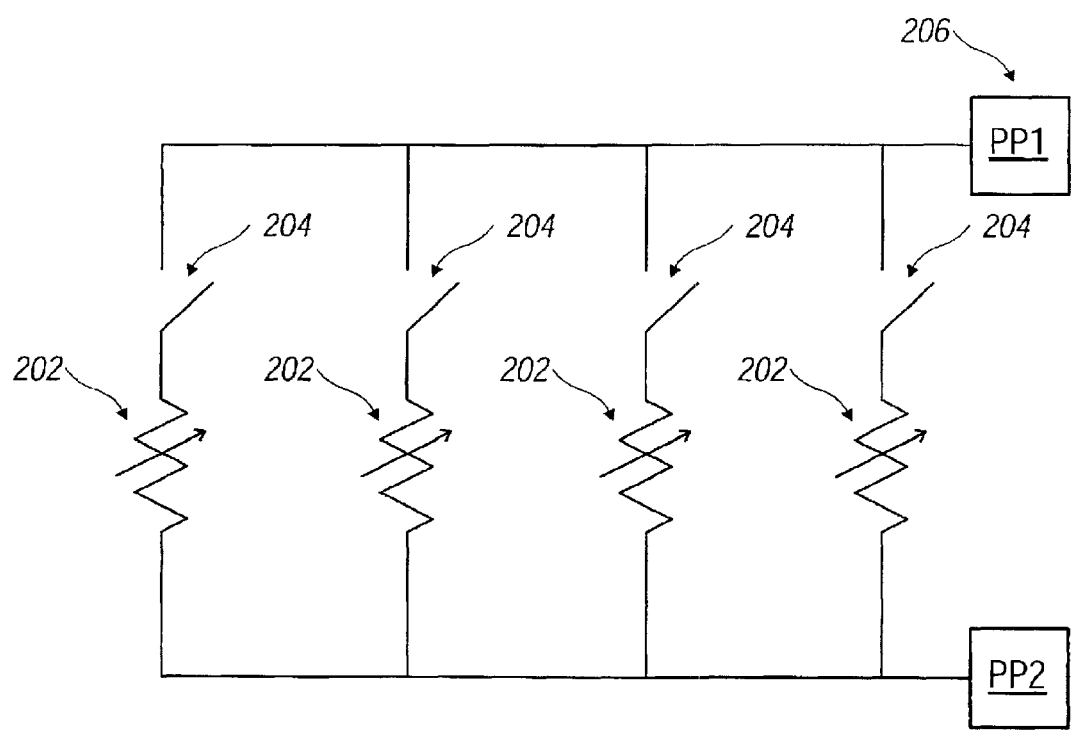
FIG. 2 is a conceptual representation of the principles of the innovative test selector.

FIG. 2 is a conceptual representation of the principles of the innovative test selector. Multiple test structures 202 can be connected to the two probe pads. Switches 204 control which of the test structures 202 is electrically connected to the probe pad 206, and consequently which test structure is actually tested when the probe pad voltage is applied and the current is measured.

FIG. 2 is merely a conceptual representation, not a full circuit diagram. The implementation of the switching function is important: preferably the switching function does not require an extra probe pad for a select input. (If an extra probe pad were required for the selection input, some of the area saved by probe pad multiplexing would be lost.) In FIG. 2, note that the test structures themselves are shown merely as variable resistors; this is because the test structures can be any one of the hundreds or thousands of known test structures.

First Sample Embodiment: Voltage Selection

Figure 3:
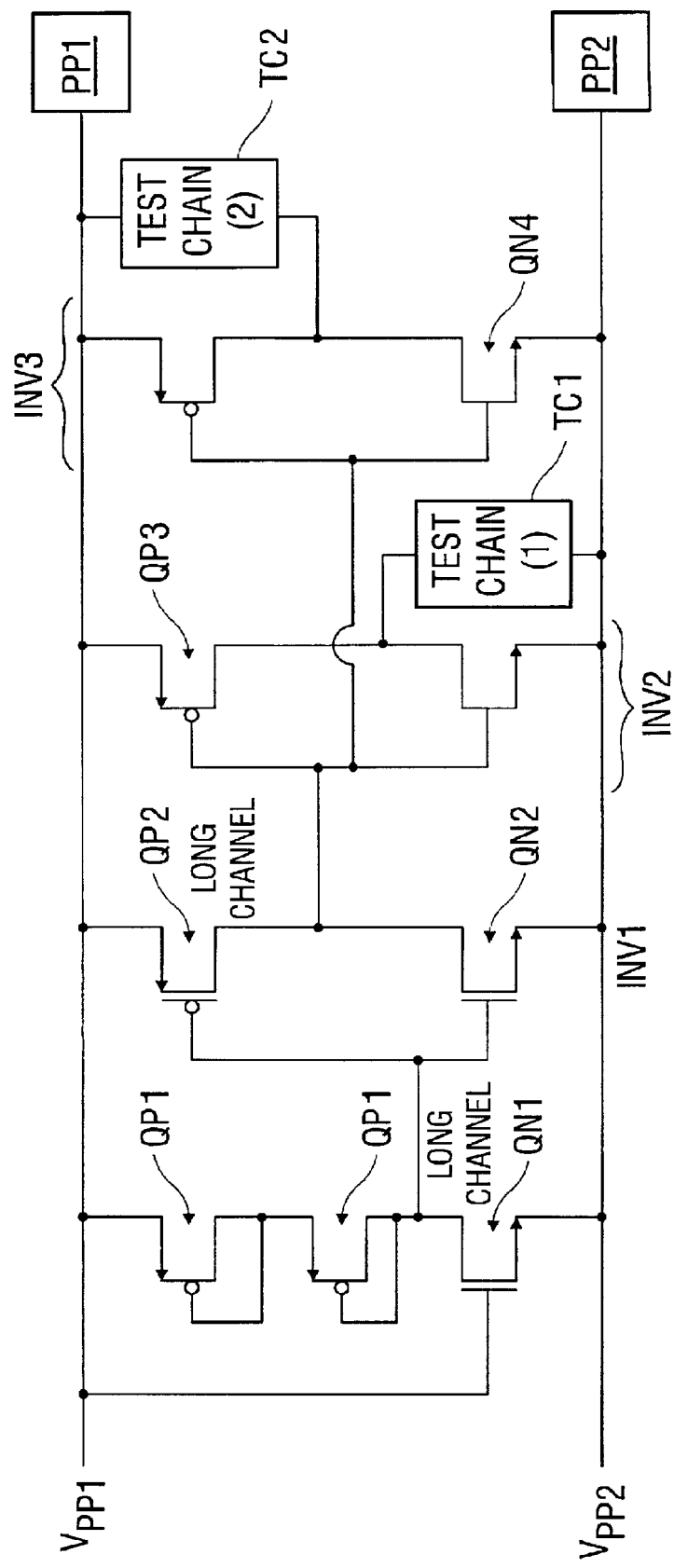
FIG. 3 shows a two-state voltage-dependent test selector.

FIG. 3 shows a first embodiment of test selectors. This example shows a two-state voltage-dependent test selector:
Condition 1

When the applied voltage $V_{PP1}-V_{PP2}$ begins to exceed $V_{TN}+V_{TP}$, long-channel NMOS transistor $Q_{N1}$ will turn on long-channel PMOS transistor $Q_{P2}$ in the amplifier stage INV1. The input to the inverter INV2 will therefore be high enough to drive and its output low. Since PMOS transistor $Q_{P3}$ is off, the first test structure $TC_1$ will not be effectively connected across the probe pads. However, since the input to inverter INV3 is also high, its NMOS $Q_{N4}$ will be turned on, and the second test structure $TC_2$ will be connected across the probe pads PP1 and PP2. (The on-state impedance of transistor $Q_{P3}$ will appear in series with the impedance of test structure $TC_2$, but by picking a reasonably high target impedance for the test structure, e.g. 20 kilohms, the test structure impedance will dominate.)
Condition 2

When the applied voltage $V_{PP1}-V_{PP2}$ rises above $V_{TN}+2V_{TP}$, transistor $Q_{N2}$ in the amplifier stage INV1 will begin to turn on, and will overpower long-channel PMOS transistor $Q_{P2}$. The input to the inverters INV2 and INV3 will therefore be low, and PMOS $Q_{P3}$ will be on. The first test structure $TC_1$ will therefore be effectively connected across the probe pads PP1 and PP2. (Again, the on-state impedance of $Q_{P3}$ will appear in series with the impedance of test structure $TC_1$, but the test structure impedance will preferably dominate.) Since transistor $Q_{N4}$ is off, the second test structure $TC_2$ will not be effectively connected across the probe pads. In this example, test structure $TC_1$ can be, for example, an Npoly/Ndiff chain, and test structure $TC_2$ can be, for example, a Ppoly/Pdiff chain.

Second Sample Embodiment: n-state Voltage Selection

Figure 4A:
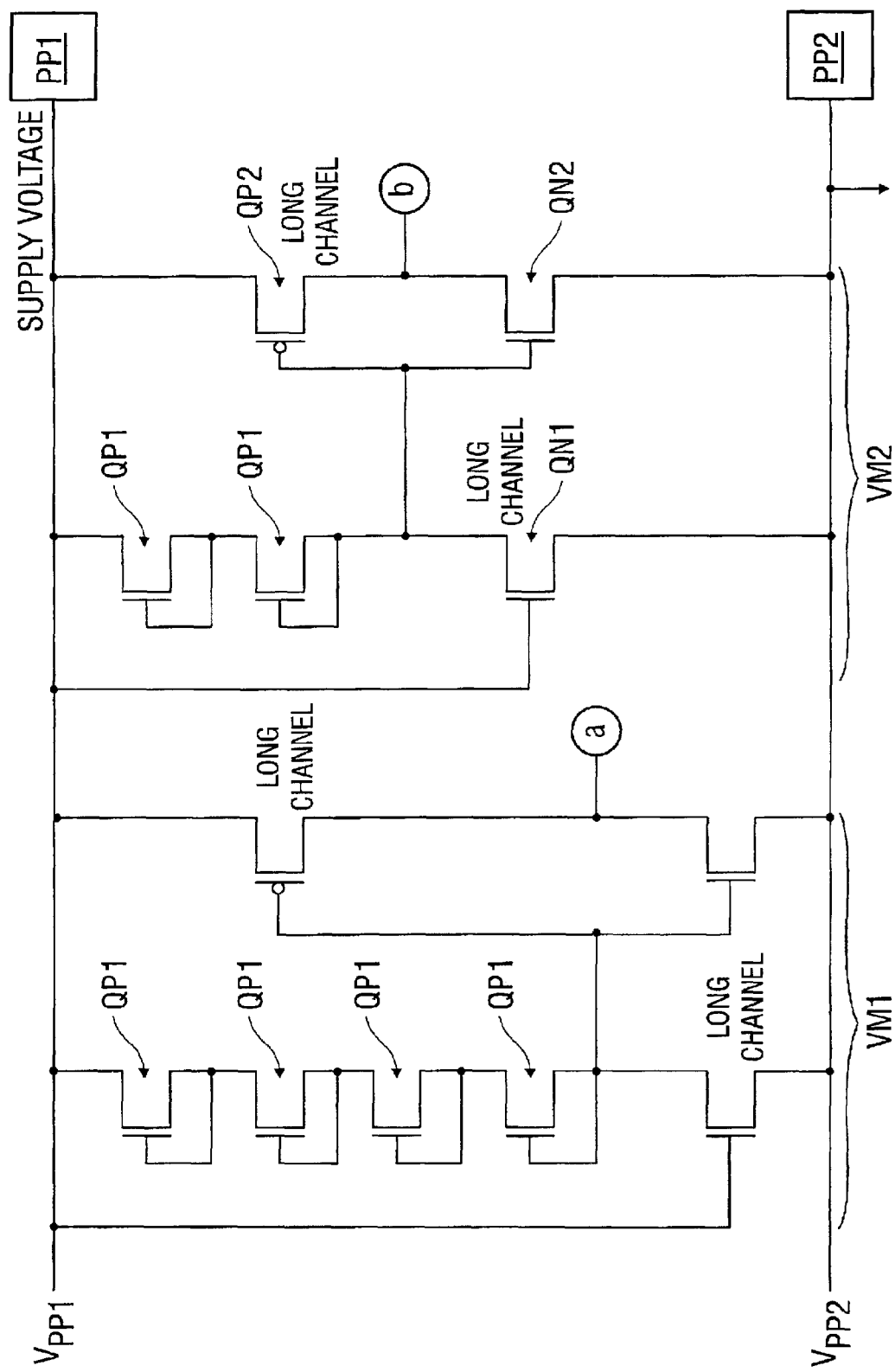
FIG. 4A shows a three-range voltage measuring circuit.

FIG. 4A shows a second embodiment of test selectors. In this embodiment two voltage measuring circuits VM1 and VM2 are used, in combination with the combinatorial logic of FIG. 4B, to select one of three test structures. Voltage measuring circuit VM2 is like that formed by $Q_{N1}/Q_{P1}/Q_{N2}/Q_{P2}$ in FIG. 3, and drives logic output b high (weakly) whenever the applied voltage $V_{PP1}-V_{PP2}$ is above $V_{TN}+V_{TP}$ and still below $V_{TN}+2V_{TP}$. When the voltage drop $V_{PP1}-V_{PP2}$ exceeds $V_{TN}+2V_{TP}$, voltage measuring circuit VM2 drives its logic output b low. Voltage measuring circuit VM1 is very similar, except that it includes four of the diode-connected PMOS transistors $Q_{P1}$ to achieve a different switching voltage: its logic output a is driven low only when the applied voltage $V_{PP1}-V_{PP2}$ exceeds $V_{TN}+4V_{TP}$.

Using the configuration shown, if both threshold voltages $V_{TN}$ and $V_{TP}$ are (for example) 0.5 volts, and if the maximum supply voltage is 3 volts, nodes a and b will both be high when the supply voltage is 1.1 volt, a will be high and b will be low at supply voltage of 2 volts, and both nodes will be low at supply voltage of 3 volts. Thus by logically combining outputs a and b, three different voltage ranges can be detected.

Figure 4B:
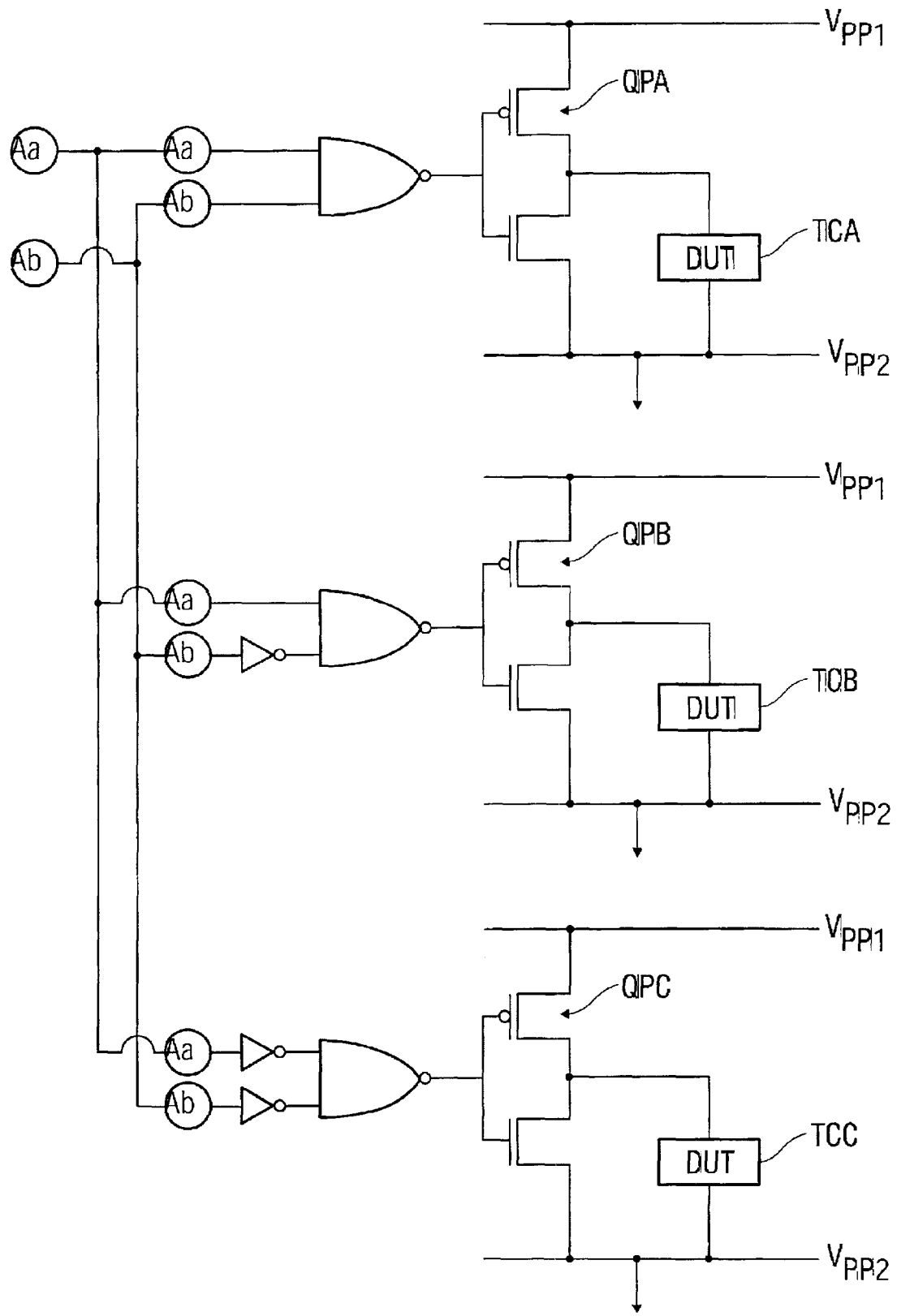
FIG. 4B shows combinatorial logic which selects one of three test structures, in dependence on the logic outputs of the voltage measuring circuit of FIG. 4A.

FIG. 4B shows an example of the combinatorial logic which, combined with the voltage measurement stages of FIG. 4A, forms a three-state test selector circuit:

Condition A

When a and b are both high, transistor $Q_{PA}$ will be turned on, to connect the first test structure $TC_A$ across the probe pads PP1 and PP2;

Condition B

When a is high and b is low, transistor $Q_{PB}$ will be turned on, to connect the second test structure $TC_B$ across the probe pads PP1 and PP2;

Condition C

When a and b are both high, transistor $Q_{PC}$ will be turned on, to connect the third test structure $TC_C$ across the probe pads PP1 and PP2.

In each case, as discussed above, the on-state impedance of a PMOS transistor will appear in series with the selected test structure's impedance.

Where it is desired to connect a test structure on the high side (i.e. directly to the higher applied voltage $V_{PP1}$), a similar configuration can be used simply by substituting AND gates for the NAND gates of FIG. 4B. It is also possible to combine high side and low side test structures if desired.

In general, n different test structures can be selected if the device parameters permit n different voltage ranges to be reliably detected within the usable range of supply voltages (i.e. above $V_{TN}+V_{TP}$ in normal CMOS processes).

Third Sample Embodiment: Sequential Selection

Figure 5A:
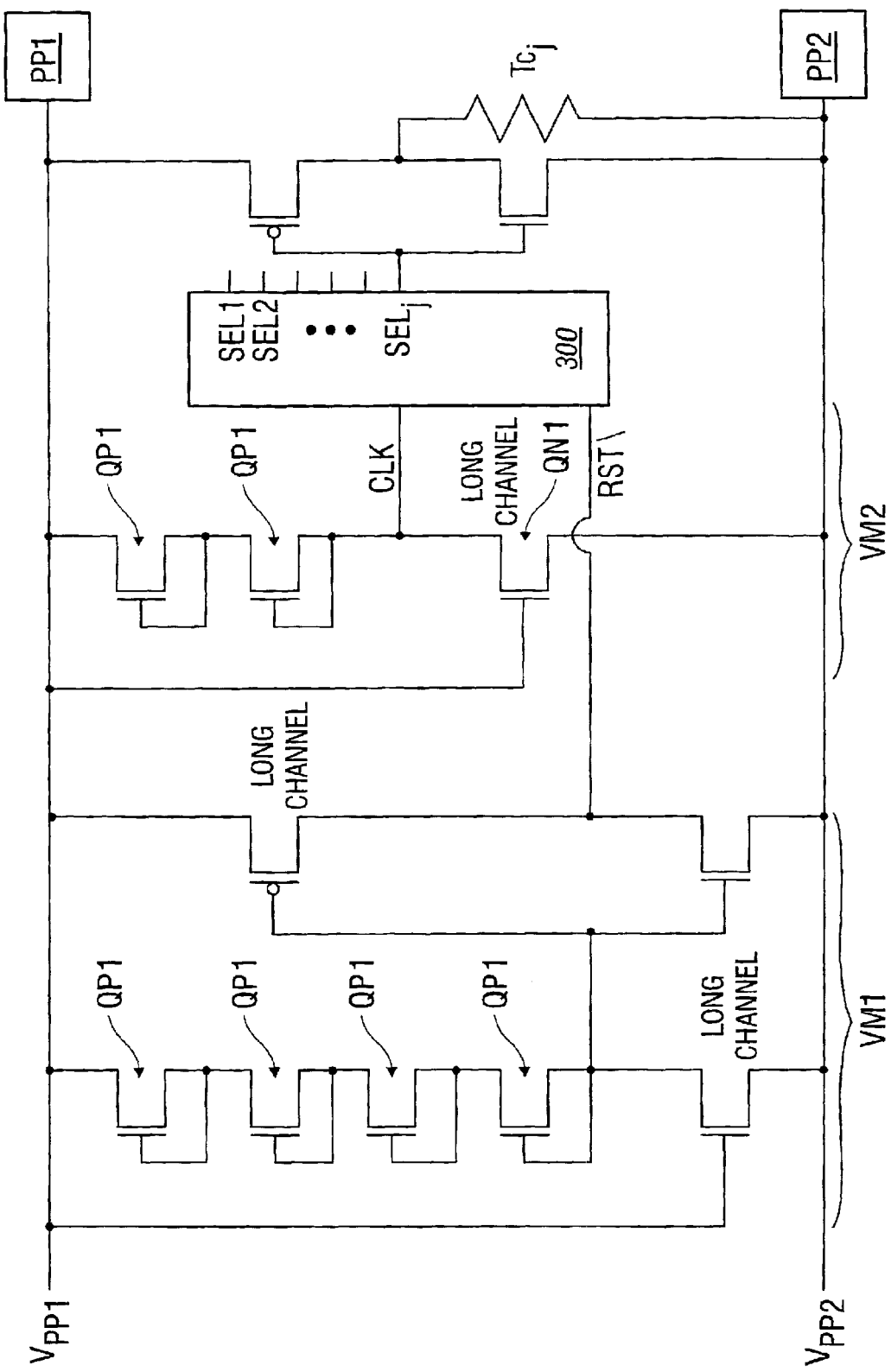
FIG. 5A shows sequential logic connected to be driven by voltage-dependent inputs.

FIG. 5A shows sequential logic connected to be driven by voltage-dependent inputs. Note that the two voltage measurement stages VM1 and VM2 are only very slightly different from those in FIG. 4A. However, one of the voltage measurement outputs is connected to drive the reset input (RST\) of a sequential logic circuit 300 (a ring or Johnson counter in this example). When the counter 300 comes out of reset (signal RST\ goes high), it drives its first output line $SEL_1$ active (high); each subsequent pulse on the clock input CLK causes the counter to drive the next output line (only) active. (The preferred embodiment is edge-triggered, so that the output actually changes state on the rising edge of the clock pulse.) Each of the test structures $TC_j$ is selected by the corresponding output; the illustrated low-side test structure is effectively connected across the probe pads PP1 and PP2 when output $SEL_j$ goes low. (For high-side test structures another inverter stage can be added.)

Figure 5B:
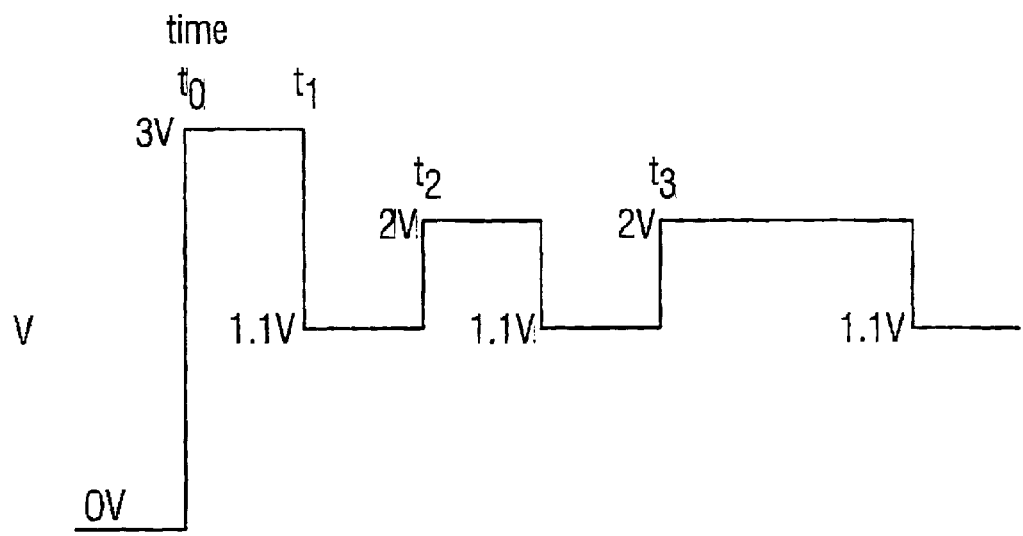
FIG. 5B shows how modulation of the voltage input is used to select the desired test structure.

FIG. 5B shows how modulation of the voltage input is used to select the desired test structure. The timing diagram in this example references the quantitative values above, i.e. both threshold voltages are 0.5 volts, and the maximum supply voltage is 3 volts. At time to the probe voltage $V_{PP1}$ is taken to 3 Volts, which drives line RST\ low. At time $t_1$ the probe voltage $V_{PP1}$ is dropped to 1.1 Volts, line RST\ goes high, the counter 300 comes out of reset, and its first select output $SEL_1$ goes active. At time $t_2$ the probe voltage is raised to 2V, and a rising edge therefore appears on the CLK line. By driving the probe voltage $V_{PP1}$ back and forth between 1.1V and 2V, as many rising edges as desired are produced on the CLK line, to sequentially select whichever of the test structures is desired.

Figure 6:
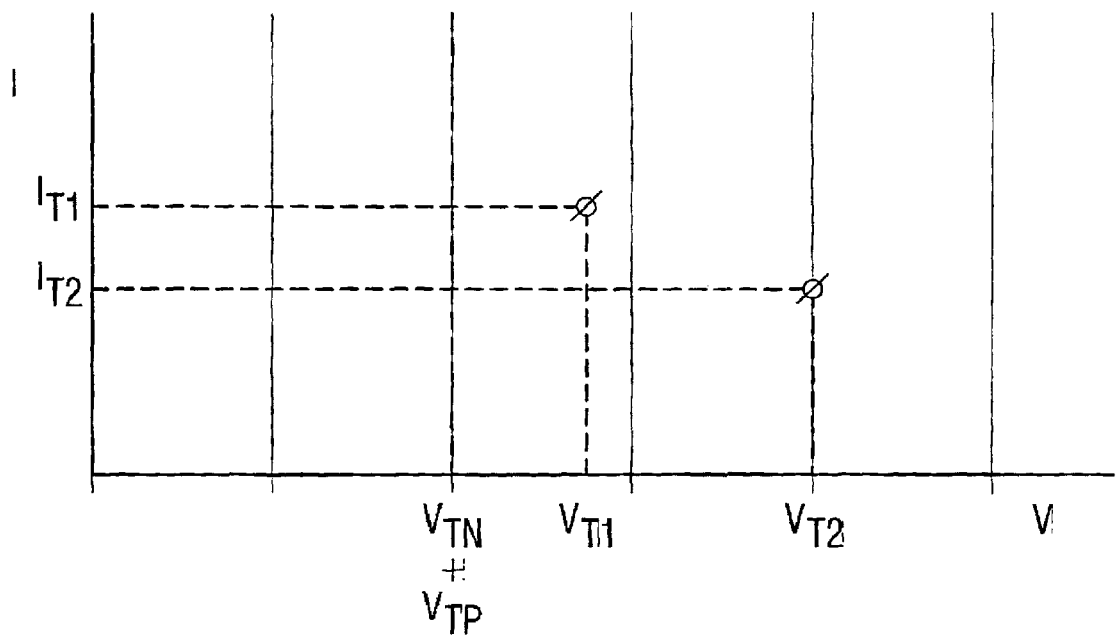
FIG. 6 schematically shows how a segmented current-voltage relation results from voltage-dependent multiplexing.

FIG. 6 schematically shows how a segmented current-voltage relation results from voltage-dependent multiplexing. This example corresponds to the circuit of FIG. 3: when the probe voltage $V_{PP1}$ is set at a first test voltage $V_{T1}$ in the neighborhood of $V_{TN}+1.7(V_{TP})$, the second test structure $TC_2$ will be connected across the probe pads PP1 and PP2, and the resulting test current $I_{T1}$ between the probes can be measured and judged against its normal range. Similarly, when the probe voltage $V_{PP1}$ is set at a second test voltage $V_{T2}$ in the neighborhood of $V_{TN}+3(V_{TP})$, the first test structure $TC_1$ will be connected across the probe pads PP1 and PP2, and the resulting test current $I_{T2}$ between the probes can be measured and judged against its normal range.

According to a disclosed class of innovative embodiments, there is provided: A partially fabricated wafer, comprising: at least one probe pad; multiple test structures which are selectably multiplexed to said probe pad in dependence on the voltage applied thereto.

According to another disclosed class of innovative embodiments, there is provided: A partially fabricated wafer, comprising: at least one probe pad; multiple test structures which are all physically close to said probe pad, and which are selectably multiplexed to said probe pad in dependence on at least one global input.

According to another disclosed class of innovative embodiments, there is provided: located in said single scribeline portion; and at least one probe pad, also located in said single scribeline portion; wherein said test selector circuit makes an electrical connection from said probe pad only to a selected one of said test structures, in dependence on the voltage applied at said probe pad.

According to another disclosed class of innovative embodiments, there is provided: A method for testing integrated circuits, comprising the steps of: applying a selection signal to a probe pad, to drive a selector circuit to connect a selected one of multiple test structures to said paid; and applying a controlled voltage to said pad, and thereby measuring the electrical characteristics of the selected one of said multiple test structures.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

One contemplated alternative embodiment uses the test selectors to perform A–B comparative testing between two test structures which are intentionally made similar but not identical. That is, one test structure can be used as a reference for the other, so that deviations due to some factors, such as linewidth or sheet resistances, can be factored out from measurements of the targeted parameter. For example, if two contact chains have identical conductors patterns, but one chain has contact dimensions have that of the other, specific contact resistance can be measured more precisely. For another example, one contact chain might contain 1024 vias, and its companion might have 2048 vias.

As discussed above, the presently preferred embodiment uses two-point probing to measure test chain resistance: a controlled voltage is applied, and the resulting small current is measured. However, in a contemplated alternative embodiment, four point probing can be used. This requires four probe pads per test structure, but provides increased accuracy for some measurements. In this case a controlled current OR voltage can be applied to the outermost pair of pads, and the resulting voltage drop read out from the probes on the intermediate pads.

In the presently preferred embodiment the selection circuitry is simply implemented with standard MOS design, and cannot be made functional until the second level of metal has been patterned. (By this time the most likely causes of yield loss have already occurred, but the data from the test structures is still useful as delayed feedback for process control.) However, in alternative embodiments it is possible that functional selectors can be achieved earlier in the process by violating normal design rules, e.g. by using diode contacts which are not part of the normal process specification.

The electrical test structures can also include long parallelled conductors (to test for excessive conductance or short circuits, or to monitor capacitance or inductive couplings.)

The electrical test structures can also include structures which test for various components of leakage current.

The preferred embodiments described above are used for DC testing, but small-signal AC testing is also possible (e.g. where it is desired to measure inductance or capacitance values). The simplest way to do this is simply to limit the AC voltage to small enough excursions (e.g. 100 mV peak-peak) to not disturb the state of the test selector.

As noted above, one of the probe pads (PP1 in the description above) is normally used for the positive (power) connection, and the other (PP2 above) is used for ground, while the wafer is held in a grounded chuck. However, it is also optionally possible to bias both probe pads away from ground if desired.

In embodiments which use sequential logic, a wide variety of implementations is of course possible, e.g. shift registers can be used.

A further modification, in embodiments which use sequential logic, is to provide for some states in which multiple test structures are selected. This can be used for rapid screening, to test several structures in parallel against an appropriately narrow target range. (If a problem is detected by such rapid screening, more precise testing can be done.)

It is alternatively possible, though much less preferable, to use a global control input for test structrue selection. However, this introduces requirements for routing of the global control signal, requires at least one additional probe pad, and complicates the process of placing test structures in the scribelines.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. A process of testing a semiconductor wafer comprising:
   a. providing a semiconductor wafer with a scribe-line region;
   b. forming a multiple test structures in the scribe-line region;
   c. forming a test selector structure in the scribe-line region communicable to the multiple test structures;
   d. forming two probe pads in the scribe-line region communicable to the multiple test structures and the test selector structure;
   e. applying a voltage signal between the two probe pads and the selector structure to select one of the multiple test structures and to cause a electrical stimulus to be applied to the selected test structure to produce a response; and
   f. measuring the response at the two probe pads.

2. The process of claim 1, wherein the selecting one of the multiple test structures is accomplished by varying the magnitude of the voltage signal.

3. The process of claim 1, wherein the selecting one of the multiple test structures is accomplished by varying the magnitude and the duration of the voltage signal.

4. The process of claim 1, wherein the voltage signal comprises a DC voltage.

5. The process of claim 1, wherein the selector structure comprises a state machine.

6. The process of claim 1, wherein the selector structure comprises logic gates.

7. The process of claim 1, wherein the selector structure comprises CMOS transistors of various sizes.

8. A semiconductor device comprising:
   a. semiconductor wafer with a scribe-line region;
   b. a multiple test structures in the scribe-line region;
   c. a test selector structure in the scribe-line region communicable to the multiple test structures;
   d. two probe pads in the scribe-line region communicable to the multiple test structures and the test selector structure;
   e. the device adapted to receive a voltage signal between the two probe pads and the selector structure to select one of the multiple test structures and to cause a electrical stimulus to be applied to the selected test structure to produce a response; and
   f. the response measurable at the two probe pads.

9. The device of claim 8 wherein the selector structure is a multiplexer adapted to select only one test structure at a given voltage signal.

10. The device of claim 8, wherein the selecting one of the multiple test structures is accomplished by varying the magnitude and the duration of the voltage signal.

11. The device of claim 8, wherein the selecting depends on the magnitude the voltage signal.

12. The device of claim 8, wherein the selecting depends on the magnitude and the duration of the voltage signal.

13. The device of claim 8, wherein the selector structure comprises CMOS transistors of various sizes.

14. The device of claim 8, wherein the selector structure comprises logic gates.

* * * * *